United States Patent [19]

Wisniewski

[11] Patent Number: 4,612,507

[45] Date of Patent: Sep. 16, 1986

[54] DIGITAL LIMITER

[75] Inventor: Jacob H. Wisniewski, Palo Alto, Calif.

[73] Assignee: Ford Aerospace & Communications Corporation, Detroit, Mich.

[21] Appl. No.: 644,850

[22] Filed: Aug. 27, 1984

[51] Int. Cl.[4] .......................... H03K 5/08; H03G 11/00
[52] U.S. Cl. .................................. 328/169; 307/540; 328/172; 333/81 R
[58] Field of Search ............... 307/261, 540, 552, 555; 328/168, 169, 172, 173; 333/81 R; 364/550, 574

[56] References Cited

U.S. PATENT DOCUMENTS

| | | |
|---|---|---|
| 3,883,817 | 5/1975 | Cliff . |
| 3,930,256 | 12/1975 | Amemiya ............................. 328/168 |
| 4,191,995 | 3/1980 | Farrow ................................ 328/168 |
| 4,263,565 | 4/1981 | Astle . |
| 4,412,299 | 10/1983 | Huffman . |

OTHER PUBLICATIONS

Linear Integrated Circuits, RCA (1982), pp. 316, 322, "CMOS Video Speed 6-Bit Flash Analog-to-Digital Converter".

Signetics TTL catalogue, (1983), p. 4-241, Logic Products.

Primary Examiner—John Zazworsky
Attorney, Agent, or Firm—Edward J. Radlo; Clifford L. Sadler

[57] ABSTRACT

A soft digital limiter (2) for limiting an analog input signal (1) from a maximum expected range (61) to a useful range (60). The number (m) of desired levels of resolution in the limiter (2) is preselected to be any power of two. An analog-to-digital converter (9) converts the input analog signal (1) to a digital representation (20). The converter (9) has its input voltage rating matched to the maximum expected range (61) and its output resolution matched to the preselected degree (m) of resolution. In the preferred two's complement numbering system, the condition for the input signal (1) falling within the useful range (60) is that the most significant p+1 bits of the digital representation (20) are all identical, where p is the number of bits required by the converter (9) to delineate that portion of the maximum expected range (61) outside of the useful range (60). A network of comparators (e.g., 38, 39) implements this condition.

5 Claims, 4 Drawing Figures

FIG. 3
DIGITAL REPRESENTATION 20

| DECIMAL NOTATION | BINARY NOTATION | TWO'S COMPLEMENT NOTATION | |
|---|---|---|---|
| + 1 5 | + 1 1 1 1 | 0 1 1 1 1 | |
| + 1 4 | + 1 1 1 0 | 0 1 1 1 0 | |
| + 1 3 | + 1 1 0 1 | 0 1 1 0 1 | |
| + 1 2 | + 1 1 0 0 | 0 1 1 0 0 | |
| + 1 1 | + 1 0 1 1 | 0 1 0 1 1 | |
| + 1 0 | + 1 0 1 0 | 0 1 0 1 0 | |
| + 9 | + 1 0 0 1 | 0 1 0 0 1 | |
| + 8 | + 1 0 0 0 | 0 1 0 0 0 | ~54 |
| + 7 | + 0 1 1 1 | 0 0 1 1 1 | |
| + 6 | + 0 1 1 0 | 0 0 1 1 0 | |
| + 5 | + 0 1 0 1 | 0 0 1 0 1 | |
| + 4 | + 0 1 0 0 | 0 0 1 0 0 | ~53 |
| + 3 | + 0 0 1 1 | 0 0 0 1 1 | |
| + 2 | + 0 0 1 0 | 0 0 0 1 0 | ~52 |
| + 1 | + 0 0 0 1 | 0 0 0 0 1 | ~51 |
| 0 | 0 0 0 0 | 0 0 0 0 0 | |
| - 1 | - 0 0 0 1 | 1 1 1 1 1 | |
| - 2 | - 0 0 1 0 | 1 1 1 1 0 | |
| - 3 | - 0 0 1 1 | 1 1 1 0 1 | |
| - 4 | - 0 1 0 0 | 1 1 1 0 0 | |
| - 5 | - 0 1 0 1 | 1 1 0 1 1 | |
| - 6 | - 0 1 1 0 | 1 1 0 1 0 | |
| - 7 | - 0 1 1 1 | 1 1 0 0 1 | |
| - 8 | - 1 0 0 0 | 1 1 0 0 0 | |
| - 9 | - 1 0 0 1 | 1 0 1 1 1 | |
| - 1 0 | - 1 0 1 0 | 1 0 1 1 0 | |
| - 1 1 | - 1 0 1 1 | 1 0 1 0 1 | |
| - 1 2 | - 1 1 0 0 | 1 0 1 0 0 | |
| - 1 3 | - 1 1 0 1 | 1 0 0 1 1 | |
| - 1 4 | - 1 1 1 0 | 1 0 0 1 0 | |
| - 1 5 | - 1 1 1 1 | 1 0 0 0 1 | |
| - 1 6 | - 1 0 0 0 0 | 1 0 0 0 0 | |

MAXIMUM EXPECTED RANGE 61

DIGITAL LIMITER

TECHNICAL FIELD

This invention pertains to the field of limiting, by digital means, an input analog signal to within a preselected useful range.

BACKGROUND ART

A limiter is often used at the front end of a baseband receiver to limit the fluctuations in the amplitude of the input signal applied thereto. In a coherent receiver employing a phase lock loop (PLL), the loop bandwidth is a function of the input power, and any fluctuation of this power causes a fluctuation in loop bandwidth. With no limiter, the signal and noise range may vary over several orders of magnitude, damaging loop components, especially the phase detector (multiplier). Baseband signal processors not having PLL's still use limiters when a compromise has to be made between poorer resolution while covering the full range and limiting the range to achieve better resolution.

Conventional limiters are analog, wherein the amplitude limiting is achieved by limiting the DC voltage level applied to processing circuits. This causes unwanted distortion due to nonlinear circuit operation and drift of component parameters because of temperature changes and aging.

U.S. Pat. No. 3,883,817 discloses an analog limiter 86 having only two output levels, i.e., it is a "hard" limiter. On the other hand, the present invention is a digital limiter; and it resolves the input signal to $2^n$ levels, where n is arbitrary, i.e., it is a "soft" limiter.

U.S. Pat. No. 4,263,565 describes another example of an analog limiter.

U.S. Pat. No. 4,412,299 discloses two limiters 10, 11, which, "in a conventional manner, square the wave shape of the high and low frequency components of the incoming signals before they are applied to the tone receiver 12". Col. 5, lines 49-52.

DISCLOSURE OF INVENTION

The present invention is a digital limiter (2) for limiting the amplitude of an input analog signal (1) to a preselected useful range (60). The limiter (2) is digital in that the signal (1) is first converted into a digital representation (20), the limiting is performed using digital circuitry, and the output (40) is digital, although it may be reconverted to analog form, by means of a digital-to-analog converter, for subsequent processing. The output (40) is a digital number having $2^n$ levels, where n is arbitrary and is preselected to give the desired degree of accuracy for the output signal (40) within the useful range (60). In other words, the present limiter (2) is a soft limiter. Signals (1) having an amplitude greater than the high end (62) of the useful range (60) are outputted as a digital number (40) equivalent to said high end (62). Signals (1) having an amplitude lower than the low end (63) of the useful range (60) are outputted as digital numbers (40) having values equivalent to said low end (63). No physical distortion of the input signal (1) is involved in the process.

An A/D converter (9) converts the input analog signal (1) into a digital representation (20) having n+p bits. This digital representation (20) is then examined to see whether it falls within or without the useful range (60). In a preferred embodiment, the digital representations (20) are written in two's complement binary notation, and a determination is made that the digital representation (20), and hence the analog input signal (1), falls within the useful range (60) when and only when the following condition is satisfied: the most significant p+1 bits of the digital representation (20) are all identical. A comparison circuit (2) implements this condition.

BRIEF DESCRIPTION OF THE DRAWINGS

These and other more detailed and specific objects and features of the present invention are more fully disclosed in the following specification, reference being had to the accompanying drawings, in which:

FIG. 3 is a table showing how several useful ranges (51, 52, 53, 54) are defined within the maximum expected range (61)

BEST MODE FOR CARRYING OUT THE INVENTION

Figure 1:
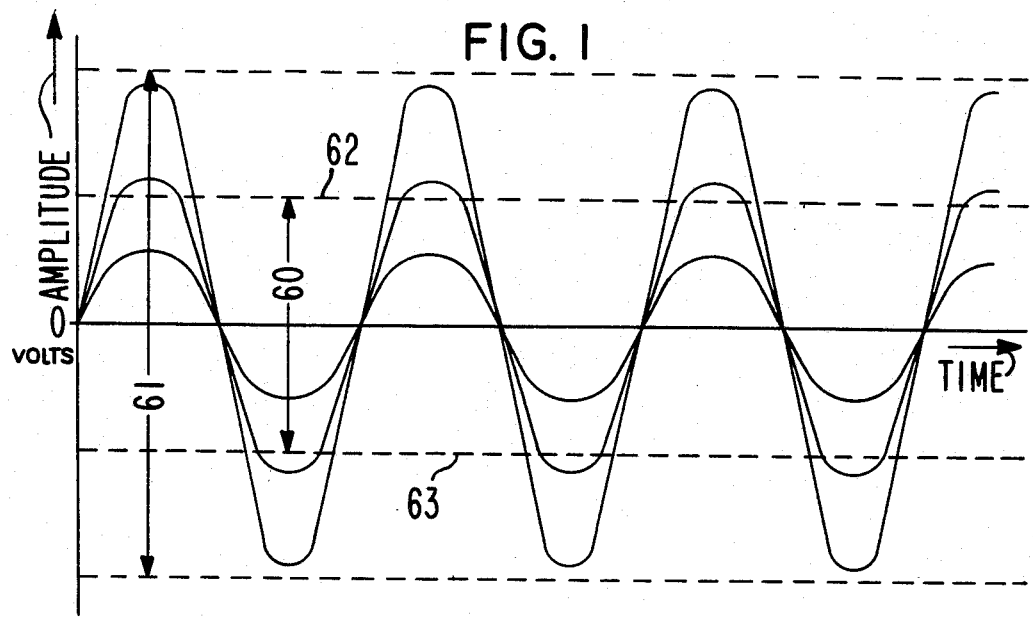
FIG. 1 is a waveform diagram illustrating input signals (1) that can be processed by the present invention.

FIG. 1 illustrates samples of typical input signals 1 that can be processed by the present invention. Signals 1 can be any modulated analog sinusoids, such as MFSK or MPSK. The amplitude of the input signal 1 is expected to vary over a maximum expected range 61, while it is desired to limit the input signal 1 to fall within a useful range 60. The user of the limiter 2 decides in advance what he wishes the resolution within the useful range 60 to be. This resolution must be a power of two. Thus, the number of levels of gradation within useful range 60 may be 2, 4, 8, 16, etc. 62 is the high amplitude boundary of useful range 60 and 63 is the low amplitude boundary of useful range 60.

Figure 2:
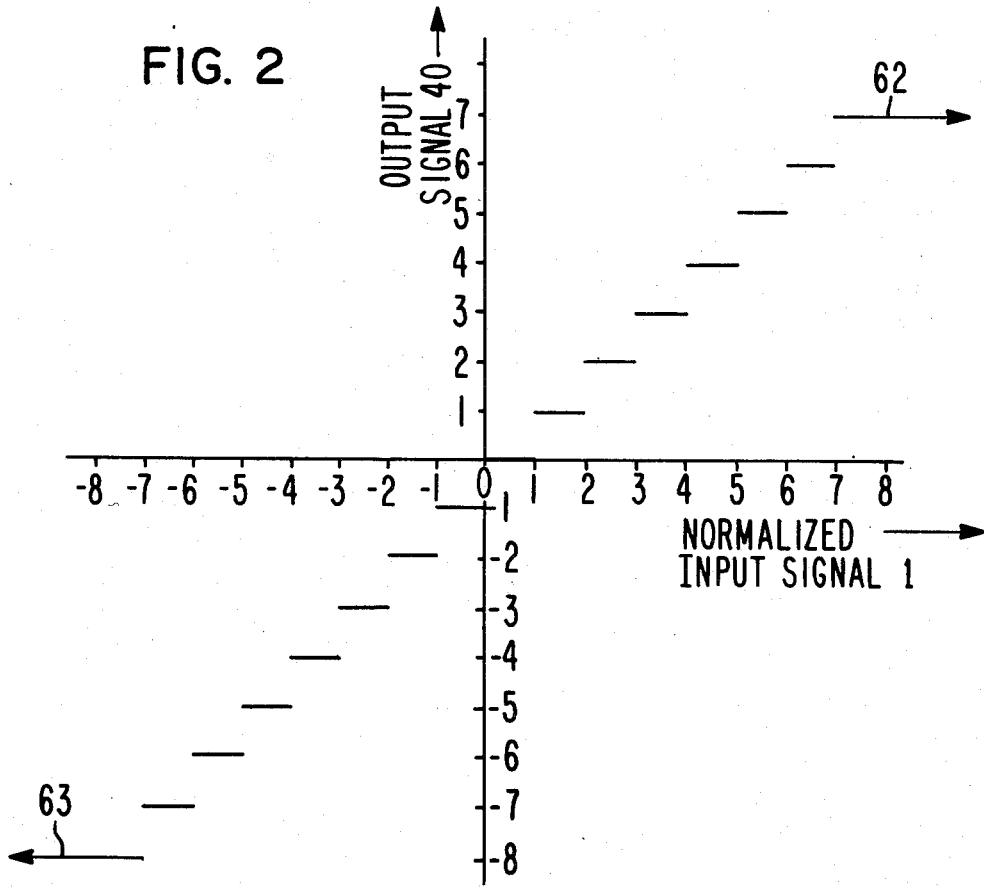
FIG. 2 is a graph showing the output (40) of the present invention for the special case of n=4.

FIG. 2 illustrates limited output 40 of the present invention for the special case where sixteen ($2^4$) levels of resolution have been chosen. A four bit binary number (output 40) is sufficient to describe these 16 levels. In decimal arithmetic, these levels are represented by the integers 0 through 7, inclusively, and $-1$ through $-8$, inclusively. In the general case, the number of desired levels of resolution is $m=2^n$. An n bit binary number (output 40) is sufficient to describe all the m levels, which are expressed as 0 through $m/2-1$, inclusively, and $-1$ through $-m/2$, inclusively.

In FIG. 2, the x axis represents the normalized input signal 1 and the y axis represents the limited output signal 40. It is seen that an input signal 1 having a normalized amplitude between 0 and 1 is assigned a value of 0 by the limiter 2; an input signal 1 having a normalized amplitude between 1 and 2 is assigned a value of 1, etc. In general, an input signal 1 having a normalized amplitude between j and j+1 is assigned a value of j, for $-8 \leq j \leq 7$. An input signal 1 having a normalized amplitude greater than or equal to 7 (the maximum limit 62 of the useful range 60) is assigned a value of 7. Similarly, an input signal 1 having a normalized value less than or equal to $-8$ (the minimum limit 63 of the useful range 60) is assigned a value of $-8$. Normalized input amplitudes c are derived from actual input amplitudes b by means of a multiplicative scaling factor K and an additive offset term: $c = bK - \frac{1}{2}$. For example, if useful range 60 of actual input amplitudes b is $-15$ volts to $+15$ volts, $K = \frac{1}{2}$. Then, applying the formula $c = b/2\frac{1}{2}$ transforms this to the normalized input amplitude c range of −8 volts to +7 volts, which is that range illustrated in FIG. 2.

A/D converter 9 is chosen to have an input voltage rating corresponding to the maximum expected range 61, and an output 20 having a number of bits n+p to match the selected resolution within the useful range 60. For example, suppose that maximum expected range 61 is ±40 volts, for a total excursion of 80 volts, and that useful range 60 is ±20 volts, for a total excursion of 40 volts. It then follows that if n bits (in output 40) are sufficient to delineate useful range 60 to the desired degree of accuracy, n+1 bits will delineate maximum expected range 61 to the same degree of accuracy (for the special case described in this paragraph, i.e., the maximum expected range 61 is twice the useful range 60). Thus, p=1. This example is illustrated in FIG. 3, where rectangular window 54 corresponds to n=4 and p=1; for this example, maximum extended range 61 is covered by n+p=5 bits.

FIG. 3 shows the values 20 of the digitized levels of resolution within range 61 in the decimal numbering system, in the binary numbering system, and in the two's complement numbering system.

The two's complement system is widely used in digital processing when both positive and negative numbers are employed, as here. In the two's complement system, the leftmost (most significant) bit represents the sign, a 1 meaning negative and a 0 meaning positive or zero. If digital representation 20 is positive, its least significant n+p−1 bits are the same in the two's complement system as they are in the binary system. If, on the other hand, digital representation 20 is negative, its two's complement form is derived from the absolute value n+p−1 bit portion of the binary form by subtracting 1, changing all the zeros to ones, and changing all the ones to zeros. Superimposed on the two's complement portion of FIG. 3 are four rectangular windows 51, 52, 53, and 54, representing useful ranges 60 for n=1, 2, 3, and 4, respectively. When n=4 and p=1, window 54 applies, and the digital representation 20 (and thus input signal 1 itself) falls within the useful range 60 if and only if the most significant two bits of the two's complement form of said digital representation 20 are identical, with identical zeros indicative of a positive or zero input signal 1 and identical ones indicative of a negative input signal 1.

Similarly, when n=3, p=2, and window 53 demarcates the useful range 60. Then the condition for the input signal 1 falling within the useful range 60 is that the three most significant bits of digital representation 20, in the two's complement numbering system, are identical. In general, the condition for input signal 1 falling within the useful range 60 is that the most significant p+1 bits of the two's complement form of the corresponding digital representation 20 are all identical, with identical zeros representing zero or positive values of the input signal 1 amplitude, and identical ones representing negative values of said input signal 1 amplitude.

Figure 4:
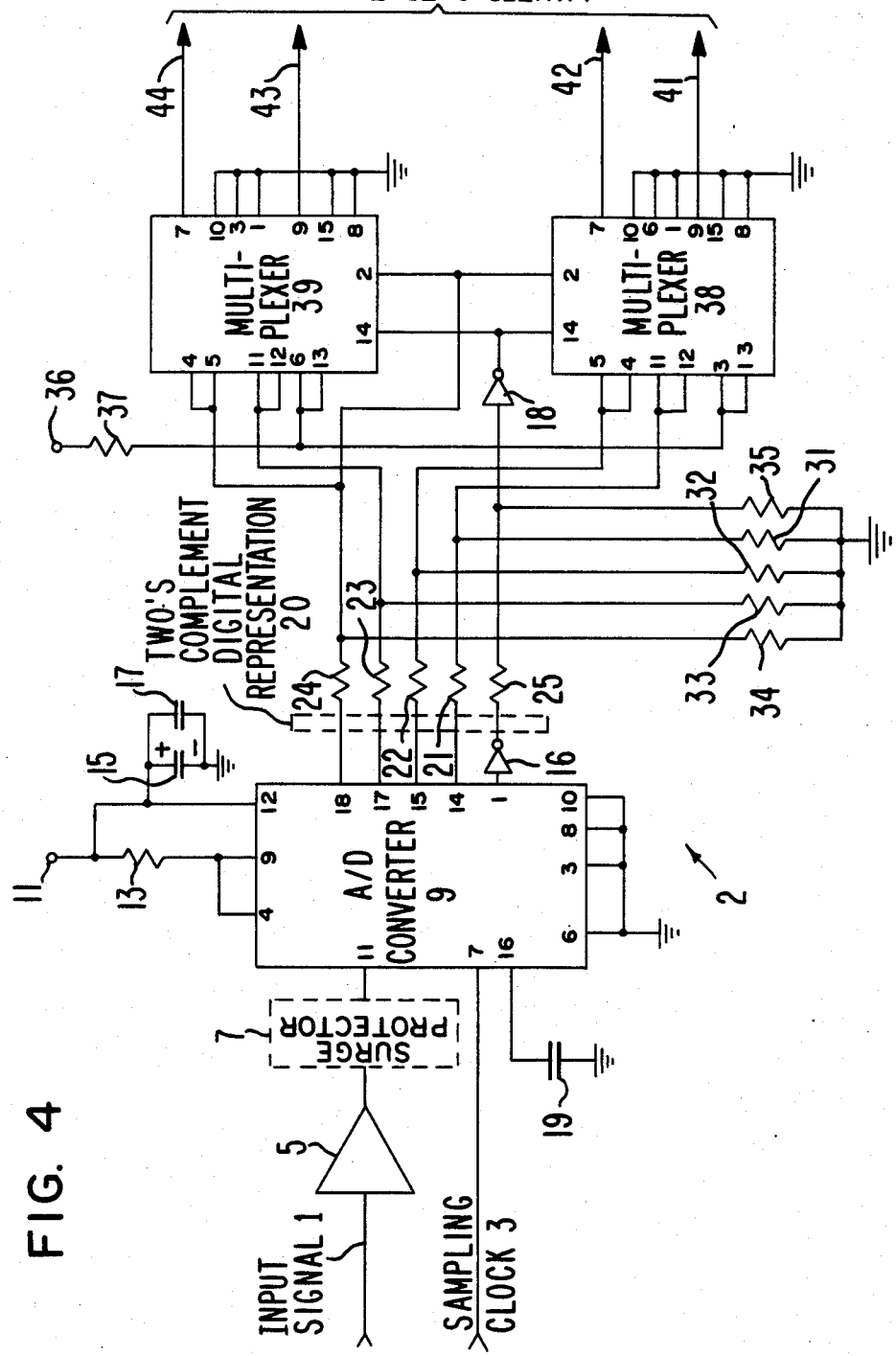
FIG. 4 is a circuit diagram of an embodiment of the present invention in which n=4 and p=1.

A circuit using digital comparators is then designed to determine whether or not the input signal 1 is within the useful range 60. FIG. 4 illustrates an example of such a circuit 2 that has been built, for the embodiment where n=4 and p=1. Input signal 1 is assumed to be at a manageable baseband frequency, and passes through unity gain impedance matching buffer amplifier 5, which transforms the impedance to the desired working value. The signal 1 may then pass through optional voltage surge protector 7 so that signals 1 outside the maximum expected range 61 are suppressed. Signals within the maximum expected range 61 are not suppressed, so that the desired output response 40 will be preserved.

Input signal 1 is then fed to pin 11 of A/D converter 9, a CMOS CA3300 six bit "flash" A/D converter produced by RCA, the least significant output bit (at pin 13) of which is not used. "Linear Integrated Circuits", RCA (1982), pp. 316, 322. Sampling clock 3 is fed to pin 7 of converter 9, and must be running at at least twice the frequency of the highest expected frequency of input signal 1. Capacitor 19 is a 0.1 microfarad capacitor connected between pin 16 of converter 9 and ground. Pins 6, 3, 8, and 10 of converter 9 are grounded. Eight volts from d.c. power supply 11 are fed through resistor 13, a 300 ohm resistor, to pins 4 and 9 of converter 9; and are fed directly to pin 12 of converter 9. Capacitor 15, a 1 microfarad electrolytic capacitor, and capacitor 17, a 0.1 microfarad capacitor, are connected in parallel between power supply 11 and ground.

Integrated circuits 38 and 39 are identical dual four-input multiplexers, i.e., each circuit 38, 39 has two 4-to-1 multiplexers thereon. In this embodiment, circuits 38, 39 are 54LS153 TTL multiplexers. The logical description of multiplexers 38 and 39 is shown in the Function Table on p. 4-241 of the 1983 Signetics TTL catalogue "Logic Products".

Five volt d.c. power supply 36 is coupled via 2 kilohm resistor 37 to pins 6 and 13 of multiplexer 39 and to pins 3 and 13 of multiplexer 38. Pins 10, 3, 1, 15, and 8 of multiplexer 39 are grounded. Pins 4 and 5 of multiplexer 39 are coupled to pin 18 of converter 9. Pins 11 and 12 of multiplexer 39 are coupled to pin 17 of converter 9. Pins 2 of each of multiplexers 38, 39 are coupled to pin 18 of converter 9. Pins 14 of each of multiplexers 38, 39 are coupled to pin 1 of converter 9.

Pins 10, 6, 1, 15, and 8 of multiplexer 38 are grounded. Pins 5 and 4 of multiplexer 38 are coupled to pin 15 of converter 9. Pins 11 and 12 of multiplexer 38 are coupled to pin 14 of converter 9.

Pin 7 of multiplexer 39 conveys the most significant bit 44 of limited output 40. Pin 9 of multiplexer 39 conveys the next most significant bit 43 of limited outut 40. Pin 7 of multiplexer 38 conveys the next most significant bit 42 of limited output 40. Pin 9 of multiplexer 38 conveys the least significant bit 41 of limited output 40.

Voltage dividers 21, 31; 22, 32; 23, 33; 24, 34; and 25, 35 drop the eight volts at the output 20 of converter 9 to a level (four volts) that can be processed by the subsequent TTL logic 38, 39. Resistors 21 through 25, and 31 through 35, are each 1 kilohm.

The n+p bits corresponding to the two's complement form of digital representation 20 exist at the output of converter 9, at pins 1 (after inversion by inverter 16), 18, 17, 15, and 14, in the order of most significant to least significant. Thus, the sign of number 20 exists at the output of inverter 16. This bit is subsequently reinverted by inverter 18 before being applied to select pin 14 of each of multiplexers 38 and 39. The second control bit, taken from pin 18 of converter 9, is the second most significant bit of digital representation 20, and is fed to select pin 2 of each of multiplexers 38 and 39. When the two most significant bits of digital representation 20 are identical, multiplexers 38, 39 pass through the four least significant bits of digital representation 20 as limited output 40. Limited output 40 conveys signals coded in two's complement notation. Thus, output 40's most significant bit 44 is the sign bit, and bits 41, 42, and 43, respectively, contain the absolute value of the limited output 40 in order of least significant bit to most significant bit.

When the most significant bit of digital representation 20 is a 1, and the next most significant bit of digital representation 20 is a 0, limited output 40 is 1 0 0 0, representing low boundary 63 of useful range 60 as desired (this condition corresponds to input signal 1 having an amplitude) lower than low boundary 63). Similarly, when the most significant bit of digital representation 20 is a 0, and the next most significant bit of digital representation 20 is a 1, the limited output 40 is 0 1 1 1, corresponding to the high boundary 62 of useful range 60 as desired (this condition exists when input signal 1 is above high boundary 62).

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A digital limiter for limiting the amplitude of an analog input signal to within a preselected useful range having preselected upper and lower boundary values, said limiter comprising:
   coupled to the input signal, means for converting the amplitude of the input signal into a digital representation;
   coupled to an output of the converting means, means for determining whether the digital representation is within the useful range, above the useful range, or below the useful range; and
   coupled to an output of the determining means, means for limiting the value of a digital representation that is above the useful range to the upper boundary value, wherein said limiting means limits the value of a digital representation that is below the useful range to the lower boundary value, and said limiting means passes through unscathed those digital representations that are within the useful range.

2. The digital limiter of claim 1 wherein:
   the useful range is divided into $m=2^n$ levels corresponding to a preselected desired number m of resolution steps equally demarcating the useful range, where m and n are positive integers:
   the digital representation is a binary number having $n+p$ bits, where p is a positive integer; and
   the least significant n bits of the binary number delineate the useful range to the preselected desired degree of accuracy.

3. The digital limiter of claim 2 wherein the binary number is expressed in two's complement notation; and
   the determining means determines that the analog input signal is within the useful range when the binary number's most significant $p+1$ bits are all identical, and determines that the analog input signal is not within the useful range when the binary number's most significant $p+1$ bits are not all identical.

4. A method for digitally limiting the amplitude of an analog signal to within a preselected useful range having upper and lower bounds, said method producing an output signal having an amplitude equal to the upper bound when the analog signal has an amplitude above the upper bound, said output signal having an amplitude equal to the lower bound when the analog signal has an amplitude lower than the lower bound, and said output signal having an amplitude of one of m discrete values when the analog signal has an amplitude within the useful range, where m is a positive integer corresponding to the preselected desired degree of resolution within the useful range;
   wherein said method comprises the steps of:
   coupling to the analog signal an analog-to-digital converter having an input voltage rating encompassing the expected overall amplitude excursion of the analog signal, and having as an output an $(n+p)$-bit number, where n and p are positive integers, wherein the least significant n bits of the $(n+p)$-bit number delineate amplitudes within the useful range to the desired degree of accuracy, and the most significant p bits of the $(n+p)$-bit number delineate that portion of the expected overall amplitude excursion outside the useful range; and
   determining when the $(n+p)$-bit number falls within the useful range.

5. The method of claim 4 wherein the $(n+p)$-bit number is a binary number expressed in two's complement notation; and
   the determining step determines that the $(n+p)$-bit number falls within the useful range when and only when the most significant $p+1$ bits of said binary number are all identical.

* * * * *